United States Patent
Mosalikanti et al.

(10) Patent No.: US 10,790,838 B1
(45) Date of Patent: Sep. 29, 2020

(54) METHOD AND APPARATUS TO PERFORM DYNAMIC FREQUENCY SCALING WHILE A PHASE-LOCKED LOOP OPERATES IN A CLOSED LOOP

(71) Applicant: Intel Corporation, Santa Clara, CA (US)

(72) Inventors: Praveen Mosalikanti, Portland, OR (US); Vaughn J. Grossnickle, Beaverton, OR (US); Syed Feruz Syed Farooq, Hillsboro, OR (US); Mark Neidengard, Beaverton, OR (US); Nasser A. Kurd, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/412,165

(22) Filed: May 14, 2019

(51) Int. Cl.
*H03L 7/189* (2006.01)
*H03L 7/099* (2006.01)
*H03L 7/197* (2006.01)
*H03L 7/085* (2006.01)

(52) U.S. Cl.
CPC .............. *H03L 7/189* (2013.01); *H03L 7/085* (2013.01); *H03L 7/099* (2013.01); *H03L 7/1972* (2013.01)

(58) Field of Classification Search
CPC ....................................................... H03L 7/189
USPC ............................................................. 331/16
See application file for complete search history.

(56) References Cited

U.S. PATENT DOCUMENTS

| 8,896,355 B1* | 11/2014 | Lu .......................... H03L 7/0995 |
| | | 327/119 |
| 2006/0049887 A1* | 3/2006 | Munker ................. H03K 21/12 |
| | | 331/179 |
| 2019/0280695 A1* | 9/2019 | Lindgren .................. H03L 7/10 |
| 2019/0393879 A1* | 12/2019 | Pi ............................ H03L 7/081 |

* cited by examiner

*Primary Examiner* — Joseph Chang
(74) *Attorney, Agent, or Firm* — Compass IP Law, PC

(57) ABSTRACT

Dynamic voltage frequency scaling to transition to a target clock frequency and associated target voltage is provided. Dynamic voltage frequency scaling to a different clock frequency is performed by gradually changing the clock frequency using discrete variable-size steps, while dynamically switching to faster or slower reference clock frequencies as appropriate to harmonize the frequency trajectory with system requirements.

20 Claims, 9 Drawing Sheets

| ClkOut (MHz) | ClkRef (MHz) | Current Ratio | Residual Ratio | |
|---|---|---|---|---|
| 500 (Init) | 100 | 30 | 113 | — 402 |
| 600 | 200 | 36 | 107 | — 404 |
| 800 | 400 | 48 | 95 | — 406 |
| 1200 | 400 | 72 | 71 | — 408 |
| 1600 | 400 | 96 | 47 | — 410 |
| 2000 | 400 | 120 | 23 | — 412 |
| 2200 | 200 | 132 | 11 | — 414 |
| 2300 | 100 | 138 | 5 | — 416 |
| 2350 | 50 | 141 | 2 | — 418 |
| 2366.67 | 33.33 | 142 | 1 | — 420 |
| 2383.33 (Target) | 16.67 | 143 | 0 | — 422 |

FIG. 4B

METHOD AND APPARATUS TO PERFORM DYNAMIC FREQUENCY SCALING WHILE A PHASE-LOCKED LOOP OPERATES IN A CLOSED LOOP

FIELD

This disclosure relates to power management of a computer system and in particular to dynamic voltage frequency scaling.

BACKGROUND

For optimal performance and power efficiency, a processor can be configured to operate with a series of different clock frequencies and associated voltages dependent on the workload in the computer system. Dynamic voltage frequency scaling is a technique implemented in a computer system to manage the computer system's power consumption by dynamically modifying a processor's clock frequency and associated voltage. A frequency and voltage operating point can be dynamically selected based on workload on the computer system. For example, a workload on a computer system may be an application for a video conference and/or an application to edit a document. Each frequency and voltage operating point can be referred to as a performance state (P-State). For a processor with 0-n power states, P-State 0(P0) can provide the maximum power and frequency and P-State n (Pn) can provide the lowest power and frequency.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 4B presents the trajectory of FIG. 4A in tabular form, showing the example transit from 500 MHz to 2383⅓ MHz output frequency annotated with the corresponding reference clock frequencies (as per FIG. 2) and output ratios relative to a 16⅔ MHz basis;

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

Circuitry to modify a clock frequency includes a phase-locked loop. A phase-locked loop (PLL) is a closed-loop frequency-control system based on a phase difference between an input clock signal (reference clock) and a feedback clock signal of a voltage controlled oscillator. The feedback clock signal is modified until the PLL is locked, that is, the reference clock and the feedback clock have the same phase and frequency.

A clock frequency change can be requested by a power management unit. The voltage is optimized based on the selected clock frequency.

Figure 1A:
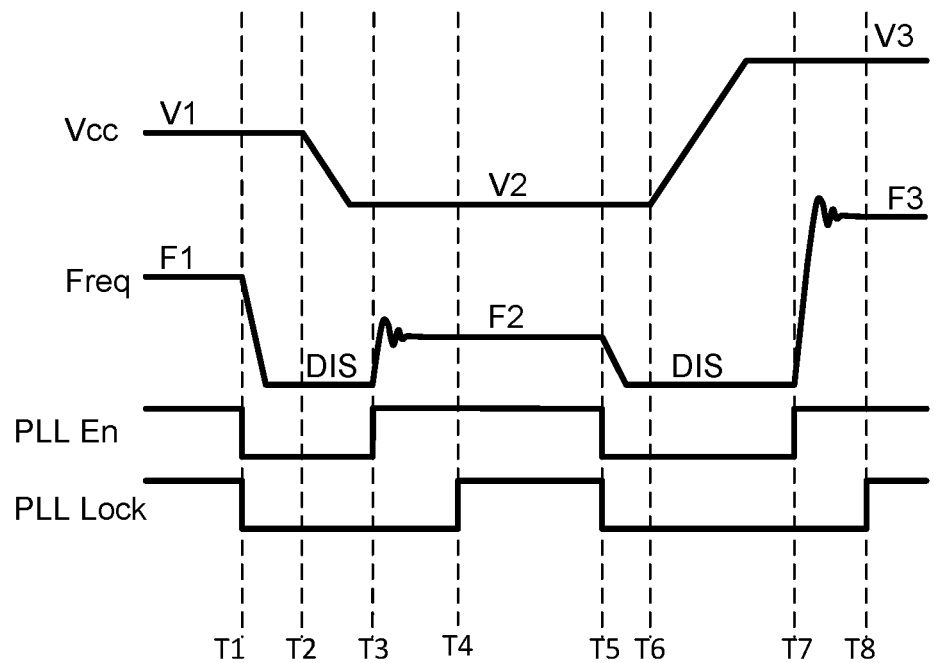
FIG. 1A illustrates an example of the use of dynamic voltage frequency scaling, where the phase locked loop is disabled during a switch to a new target frequency at a corresponding new target voltage.

FIG. 1A illustrates an example of the use of dynamic voltage frequency scaling, where the phase-locked loop is disabled during a switch to a new target frequency at a corresponding new target voltage. At time T1, the voltage is V1 and the frequency is F1 when a new target frequency F2 with associated voltage V2 is selected. After waiting until time T2 for the phase-locked loop disable to take effect, the processor voltage is ramped down slowly from voltage V1 to the target voltage V2. By time T3, the target voltage V2 is established and the phase-locked loop is re-enabled. At time T4, the target frequency F2 is locked.

At time T5, the voltage is V2 and the frequency is F2 when a new target frequency F3 and associated voltage V3 is selected. Again, the phase-locked loop is disabled, and starting at time T6 the processor voltage is ramped up slowly from the current voltage V2 to the target voltage V3. At time T7, the target voltage V3 is established and the phase-locked loop is enabled and ramps to the target frequency F3. At time T8, the phase-locked loop is locked to the target frequency F3.

The shutdown of the phase-locked loop during voltage transitions constitutes undesirable compute latency added to the full system's computations, compared to a scenario in which the phase-locked loop could operate continuously.

Figure 1B:
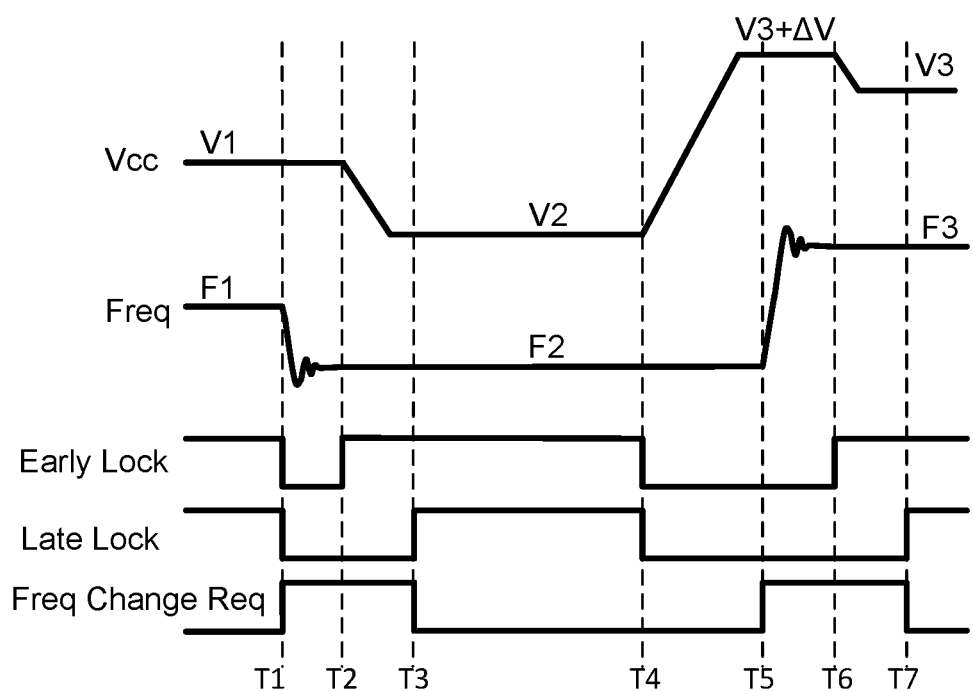
FIG. 1B illustrates an example of such continuous phase lock loop operation during dynamic voltage frequency scaling, removing some but not all undesirable latency from phase locked loop shutdown.

FIG. 1B illustrates an example of a continuous phase-locked loop operation during dynamic voltage frequency scaling, removing some but not all undesirable latency from phase locked loop shutdown. Referring to FIG. 1B, at time T1, the voltage is V1 and the frequency is F1 when a new target frequency F2 and associated new target voltage V2 is selected via a rising edge of a Freq Change Req signal. The phase-locked loop temporarily unlocks until it acquires the target frequency F2. At time T2, a rising edge of an Early Lock signal indicates that the phase-locked loop is "almost" locked. The processor voltage is ramped down slowly from voltage V1 to the target voltage V2. At time T3, the target voltage V2 is established and the phase-locked loop finishes settling to the target frequency F2. The Early Lock signal is leveraged to reduce the overall time to reach the new clock frequency and associated voltage, but clock perturbation due to the voltage ramp requires waiting from time T2 and T3 before certifying it to the rest of the system via the Late Lock signal.

At time T4, the voltage is V2, the frequency is F2 when a new target frequency F3 and associated target voltage V3 are requested. In this case, the processor voltage is ramped up slowly from the current voltage V2 to the target voltage V3, plus an offset ΔT to ensure frequency overshoot during settling does not violate timing margins.

At time T5, the target voltage V3+ΔT is reached. A frequency change request is initiated to change the frequency to the target frequency F3 is selected via a rising edge of the Freq Change Req signal. At time T6, a rising edge of the Early Lock signal indicates that the phase-locked loop is "almost" locked to the target frequency F3, and the voltage ramps gently back to V3. At time T7, the phase-locked loop is locked "final" to the target frequency F3.

In an embodiment, the phase-locked loop is not shutdown while performing dynamic voltage frequency scaling, such as a transition to a higher target clock frequency and associated target voltage. In response to a request to transition to a target clock frequency and associated target voltage that are higher than the current clock frequency and current voltage, the time to slowly ramp the voltage to the higher target voltage is used to gradually increase the frequency of the phase-locked loop in discrete variable-size frequency steps. The clock frequency is gradually increased by changing the reference clock and feedback divider ratio for the phase-locked loop. By closely shadowing the voltage ramp with the frequency ramp, excess latency is thus minimized to the extent permitted by timing margin safety and the phase-locked loop's internal behavioral constraints.

Fine frequency resolution is achieved without compromising on the phase-locked loop frequency slew rate by dynamically updating the phase-locked loop's reference clock frequency as permitted by the current ratio presently selected for the phase locked loop. The current ratio is used by a feedback divider in the phase-locked loop to select the feedback clock frequency and may also be referred to as a feedback ratio). The current ratio will be described later in conjunction with FIG. 4B and FIG. 5. Various embodiments may employ different time sequences of phase locked loop ratios and reference clock frequencies (referred to as a frequency walks) as desired.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Figure 2:
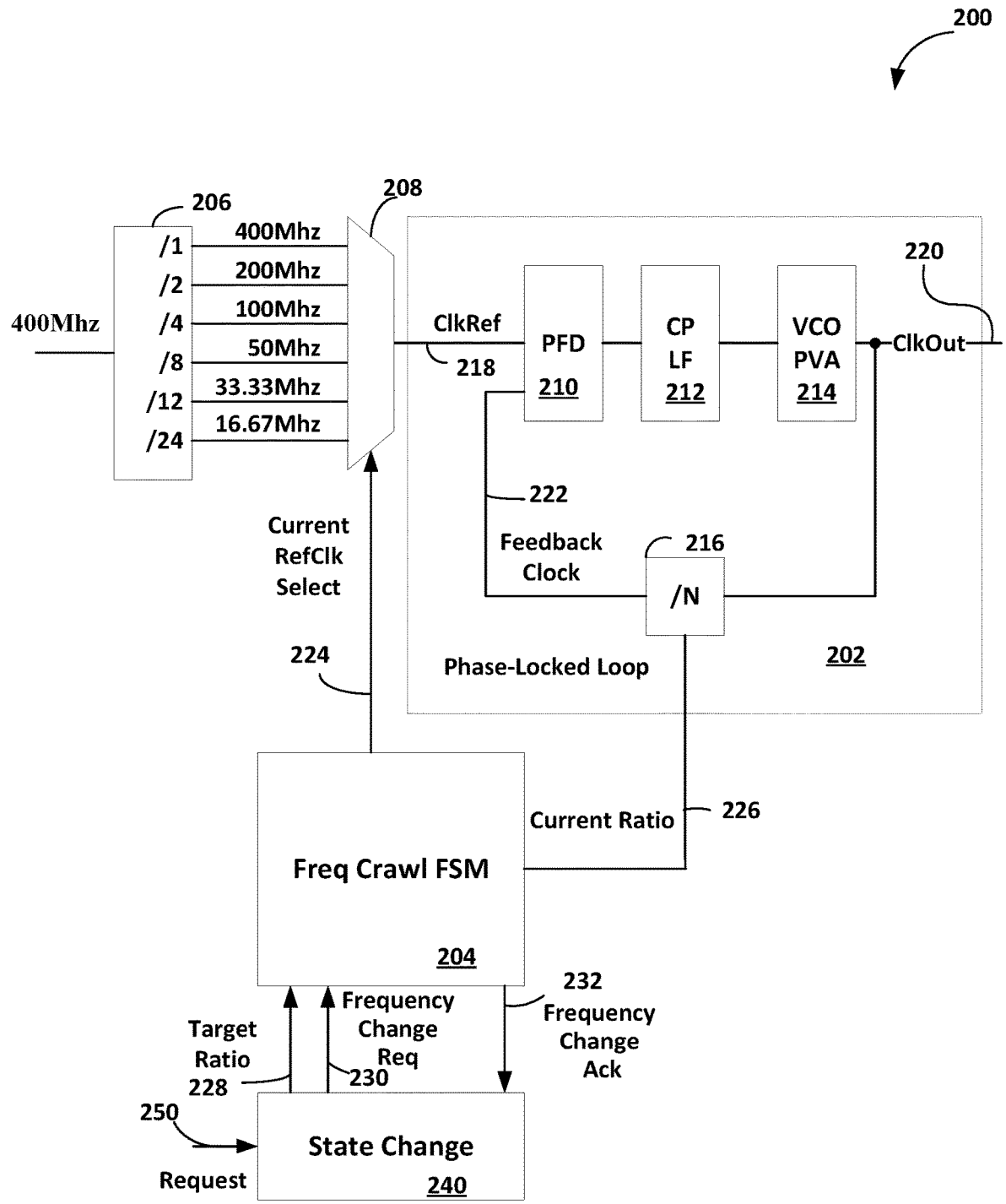
FIG. 2 is a block diagram of dynamic frequency scaling circuitry that includes a frequency crawl finite state machine to perform fine frequency resolution in response to request to change frequency of a clock.

FIG. 2 is a block diagram of dynamic frequency scaling circuitry 200 that includes a frequency crawl FSM 204 (also referred to as frequency crawl circuitry) to perform fine frequency resolution in response to a request to change frequency of a clock. The dynamic frequency scaling circuitry 200 includes state change circuitry 240, the frequency crawl FSM 204, a reference clock divider circuit 206, a multiplexer 208 and a phase-locked loop 202.

The dynamic frequency scaling circuitry 200 includes state change circuitry 240 that receives a request 250 to change clock frequency and an associated voltage. The request 250 can be generated by power management logic in the system. In response to the received request 250, the state change circuitry 240 generates a target ratio 228 and sends the target ratio 228 with a frequency change request 230 to a frequency crawl Finite State Machine (FSM) 204. The target ratio 228 is used to generate the target clock frequency.

The frequency crawl FSM 204 dynamically selects one of the available reference clocks output from the reference clock divider circuit 206 via a current RefClk Select 224 signal input to the multiplexor 208 as the reference clock for the phase-locked loop 202. The frequency crawl FSM 204 also dynamically selects a ratio for the feedback divider (/N) 216 in the phase-locked loop 202 based on the received target ratio 228 via a current ratio 226 signal.

The phase-locked loop 202 is a closed-loop frequency-control system based on a phase difference between a reference clock (ClkRef 218) and a feedback clock 222 of a voltage controlled oscillator. The phase-locked loop 202 shown in FIG. 2 includes a phase frequency detector (PFD) 210, a charge pump (CP) and loop filter (LF) 212, a feedback divider (/N) 216, and a voltage controlled oscillator (VCO) and a post voltage amplifier (PVA) 214.

In the embodiment shown in FIG. 2, a 400 megahertz (MHz) clock is input to the reference clock divider circuit 206. The reference clock divider circuit 206 divides the 400 MHz clock to provide a 400 MHz, a 200 MHz, a 100 MHz, a 50 MHz, a 33⅓ MHz and a 16⅔ MHz reference clock. One of six reference clocks output from the reference clock divider circuit is selected via a multiplexer 208 dependent on the state of current RefClk Select 224 output from the frequency crawl Finite State Machine (FSM) 204 as the reference clock (ClkRef) 218 for the phase-locked loop 202.

The phase-locked loop 202 aligns a rising edge of the reference clock (ClkRef) 218 to the feedback clock 222 using the phase frequency detector (PFD) 210. The phase frequency detector 210 detects the difference in phase and frequency between the reference clock (ClkRef) 218 and the feedback clock 222 that are input to the phase frequency detector 210 and generates an "up" or "down" control signal dependent on whether the frequency of the feedback clock 222 is lagging or leading the frequency of the reference clock (ClkRef) 218. The "up" and "down" control signals indicate whether the voltage controlled oscillator 214 is to operate at a higher or lower frequency. The 'up' or 'down' control signals are input to a charge pump charge pump (CP) and loop filter (LF) 212. In response to the 'up' control signal, the charge pump charge pump (CP) and loop filter (LF) 212 drives current into the loop filter in charge pump (CP) and loop filter (LF) 212. In response to the 'down' control signal, the charge pump 212 draws current from the loop filter in charge pump (CP) and loop filter (LF) 212. The loop filter in charge pump (CP) and loop filter (LF) 212 converts the 'up' or 'down' signal to a control voltage used to bias the voltage controlled oscillator 214.

The frequency of the voltage controlled oscillator 214 increases or decreases dependent on the control signals from the charge pump in charge pump (CP) and loop filter (LF) 212 and stabilizes when the reference clock (ClkRef) 218 and the feedback clock 222 have the same phase and frequency. The phase-locked loop 202 is locked when the reference clock (ClkRef) 218 and the feedback clock 222 are aligned (that is, have the same phase and frequency). The feedback divider (/N) 216 establishes a ratio between the VCO output clock (ClkOut) 220 and the feedback clock 222, and hence between output clock (ClkOut) 220 and ClkRef 218, via the action of the feedback loop. The loop filter charge pump (CP) and loop filter (LF) 212 converts the 'up' and 'down' control signals to a control voltage that is used to bias the voltage controlled oscillator 214.

Fine-resolution control over frequency ramp rate is contingent on the phase-locked loop's reference frequency (for example, 16.67 MHz), since the reference frequency granularity directly scales the output frequency granularity via the multiplying action of the phase-locked loop 202. The frequency of the output clock 220 can be walked to a target clock frequency (to limit a large rate of change of current (di/dt)) while keeping the phase-locked loop 202 in a closed loop. Phase error accumulation is limited through dynamic updates to selection of the reference clock (ClkRef) 218 so that there is minimal additional lock acquisition time at the end of the frequency crawl to lock to the target frequency.

Figure 3:
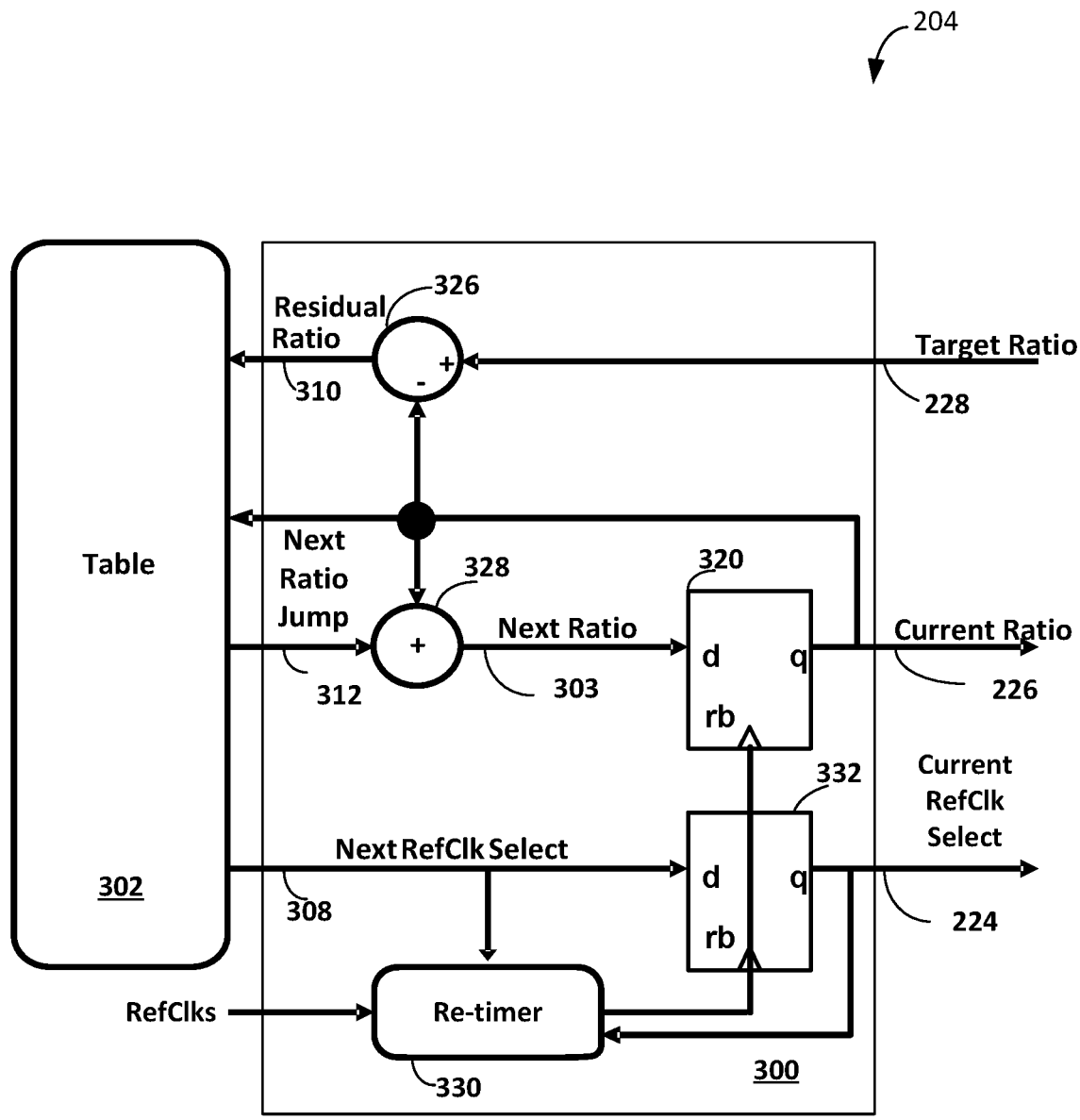
FIG. 3 is an embodiment of the frequency crawl finite state machine shown in FIG. 2.

FIG. 3 is an embodiment of the frequency crawl FSM 204 shown in FIG. 2. It includes a table 302 and circuitry 300 to provide the current ratio 226 and current RefClk Select 224 based on the residual ratio 310, calculated as the difference between target ratio 228, and current ratio 226. The circuitry 300 includes latches 320, 332, a re-timer 330 and adders 326, 328.

The operation of the Frequency Crawl FSM 204 in FIG. 3 will be described in conjunction with FIG. 2 and an example of an increase in frequency shown in FIGS. 4A-4B and FIG. 5.

Figure 4A:
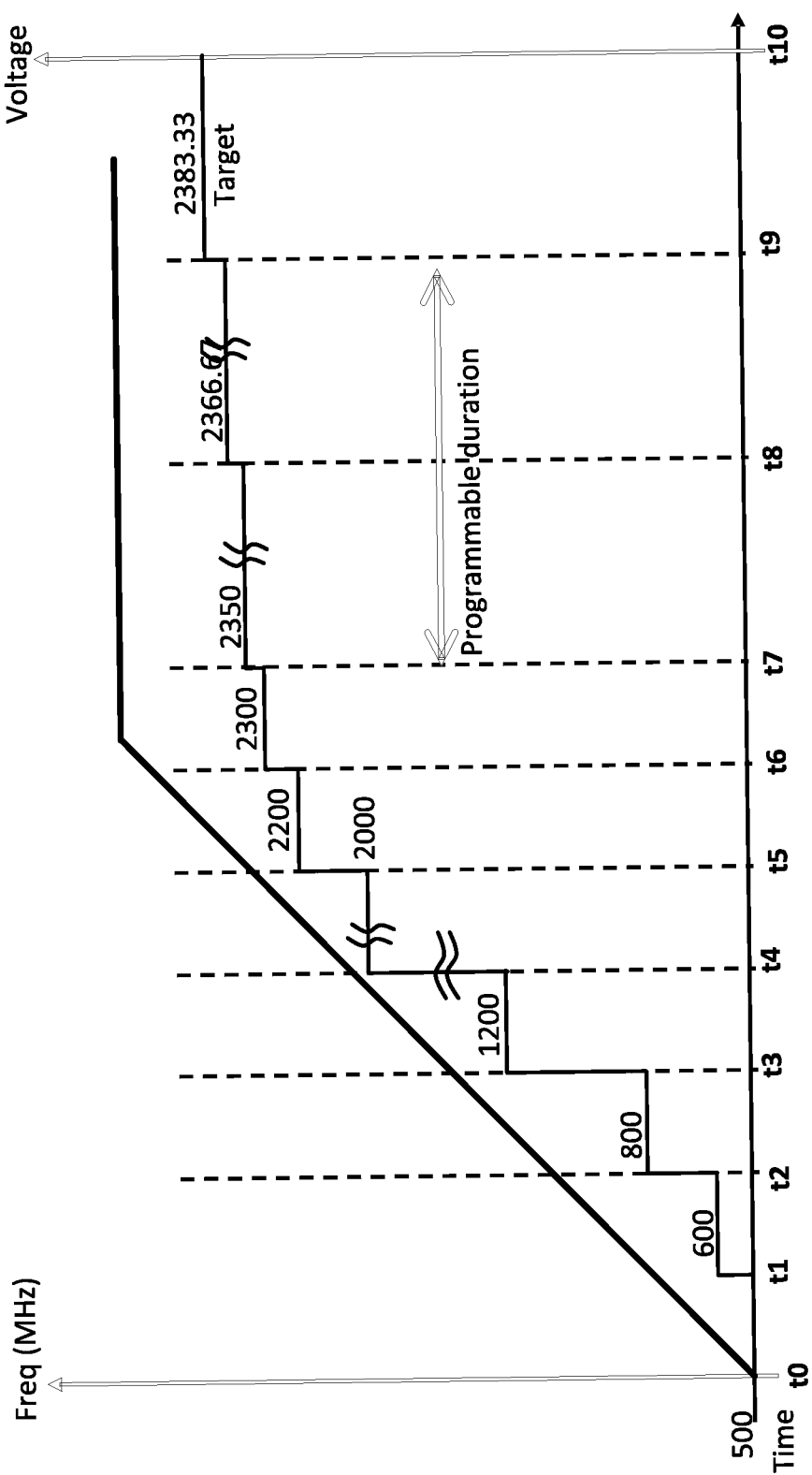
FIG. 4A is a diagram illustrating an example frequency ramp up with variable step sizes using dynamic RefClk update, achieving both fast transit and fine target frequency resolution without transgressing a leading voltage envelope change.

FIG. 4A is a diagram illustrating an example frequency ramp up with variable step sizes using dynamic RefClk update, achieving both fast transit and fine target frequency resolution without transgressing a leading voltage envelope change.

The fast frequency transit with fine frequency resolution is performed by employing a dynamically-updated reference clock that is opportunistically sped up in the middle of the transit.

FIG. 4B presents the trajectory of FIG. 4A in tabular form, showing the example transit from 500 MHz to 2383⅓ MHz output frequency annotated with the corresponding reference clock frequencies (as per FIG. 2) and output ratios (current ratio and residual ratio expressed as multiples of (100 MHz/6)=16⅔ MHz).

In the example, the target ratio 228 (FIG. 2) is 143, that is, the target frequency (2383.33 MHz) divided by the size of the smallest frequency step (16.67 (16⅔) MHz). The current ratio 226 (FIG. 2) is the frequency of the ClkOut 220 divided by the size of the smallest frequency step (16.67 (16⅔) MHz). For example, in row 402, the current ratio is 30, that is, the frequency of ClkOut 220 (500 MHz) divided by the size of the smallest frequency step (16.67 (16⅔) MHz). The residual ratio 424 is the difference between the current ratio 226 and the target ratio 228.

The example illustrates choices of reference clock frequencies as the output clock gradually increases in variable-size discrete frequency steps from 500 MHz to 2383⅓ MHz, via the dynamic frequency scaling circuitry 200 shown in FIG. 2. As shown in FIG. 4B, the frequency ramp up always lags the voltage ramp up to ensure positive timing margin, and the frequency slew rate may be changed over time to optimize such quantities as total transit time, supply disturbance from frequency-dependent current load changes, and phase-locked loop behavior.

Figure 5:
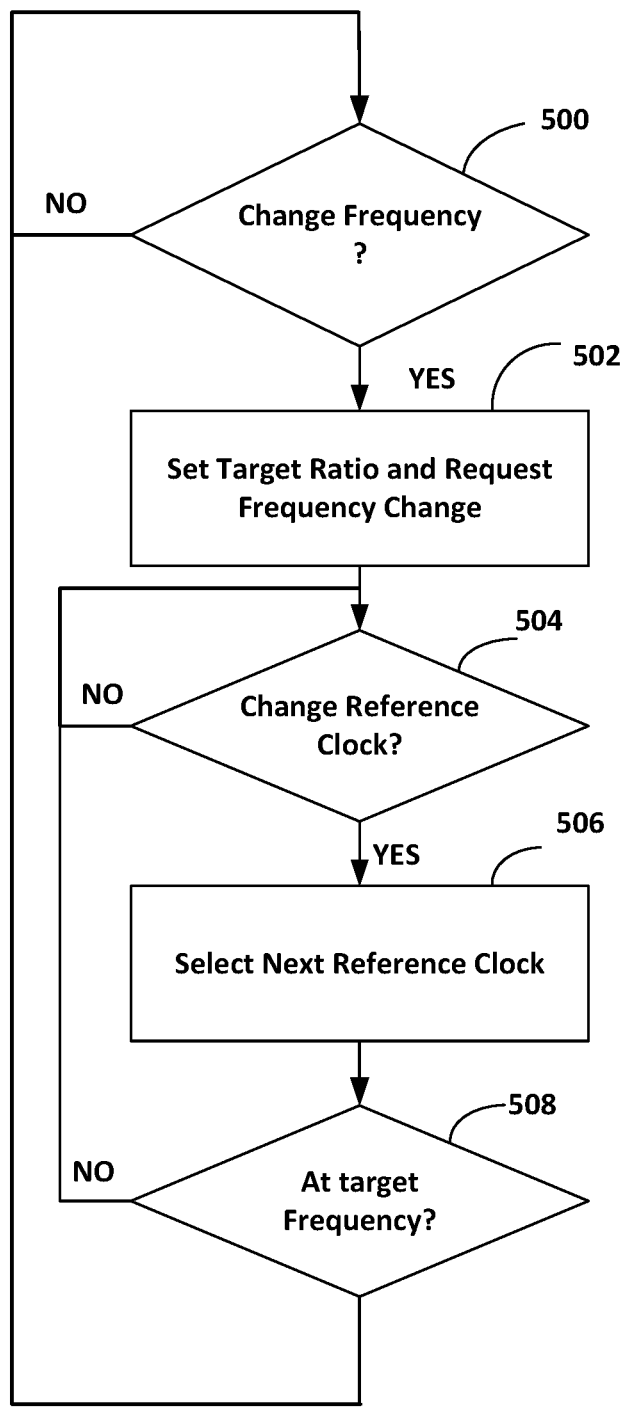
FIG. 5 is a flowgraph illustrating a method implemented in the dynamic frequency scaling circuitry shown in FIG. 2 to gradually increase the frequency of output clock, producing the ramp up as shown in FIGS. 4A-4B.

FIG. 5 is a flowgraph illustrating a method implemented in the dynamic frequency scaling circuitry 200 (FIG. 2) to gradually increase the frequency of output clock 220 (FIG. 2) in discrete variable-size frequency steps from 500 MHz to 2383⅓ MHz while the voltage is ramping up as shown in FIGS. 4A-4B.

Referring to FIG. 5, at block 500, the initial frequency of the output clock 220 is 500 MHz and the reference clock (ClkRef) is 100 MHz as shown in first row 402 of table 400 (FIG. 4B). The current ratio 226 (FIG. 2) is 5, corresponding to a basis (16⅔) ratio of 30 (as in FIG. 4B). If a request 250 (FIG. 2) to change the frequency of the output clock 220 is received, processing continues with block 502. If not, processing continues with block 500 to wait for a request 250 to change the frequency of the output clock 220.

At block 502, a request to change the frequency of the output clock 220 has been received. State change circuitry 240 (FIG. 2) outputs a target ratio 228 and a frequency change request 230 in response to the request 250 to change the frequency of the output clock 220. The frequency crawl FSM 204 (FIG. 2) receives the target ratio 228 and a frequency change request 230 and initiates the process to perform a frequency crawl based on the received target ratio 228.

Referring to FIG. 3, each increase in frequency is dependent on current ratio (modulus 24) 226, current RefClk Select 224and residual ratio 310. At block 504, if the residual ratio 310 differs from zero, there is a frequency step change, processing continues with block 506. If not, processing continues with block 504 to wait for a frequency step change.

At block 506, the next reference clock is selected from table 302 as discussed in conjunction with block 502.

At block 508, if the frequency of the output clock 220 has reached the target frequency, processing is complete. If not, processing continues with block 504 to continue to gradually increase the frequency of the output clock (by selecting the nearest faster reference clock) to the target frequency while the voltage ramps up to the target voltage. Supply voltage droop events are avoided by gradually increasing the frequency of the output clock to limit a large rate of change of current (di/dt)).

Figure 6:
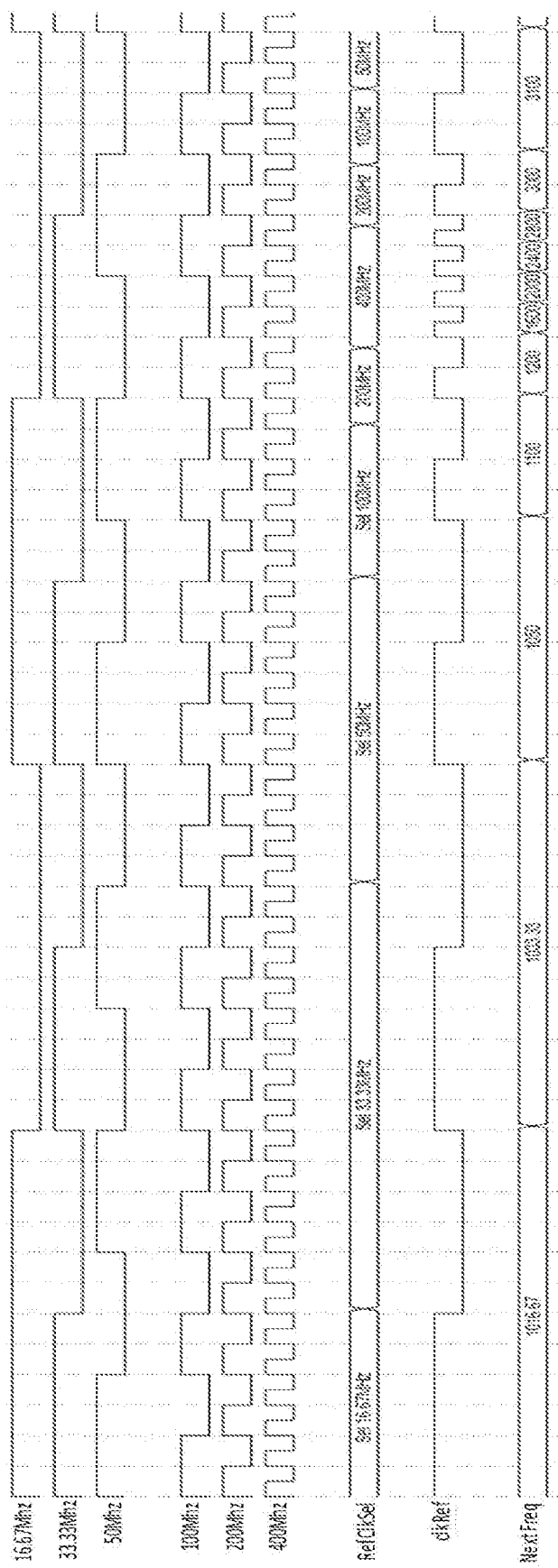
FIG. 6 is a timing diagram illustrating a method implemented in the dynamic frequency scaling circuitry shown in FIG. 2 to gradually increase the frequency of output clock shown in FIG. 2 from 1016⅔ MHz to 3100 MHz while the voltage is ramping up.

FIG. 6 is a timing diagram illustrating a method implemented in the dynamic frequency scaling circuitry 200 shown in FIG. 2 to gradually increase the frequency of output clock shown in FIG. 2 from 1016⅔ MHz to 3100 MHz while the voltage is ramping up. For illustration purposes, each "Next frequency" is held for one ClkRef cycle. In an implementation, the duration (which can also be referred to as a step duration) for which the frequency crawl FSM 204 uses a ClkRef frequency is programmable as described earlier.

An embodiment has been described for dynamic voltage frequency scaling to transition to a higher target clock frequency and associated target voltage. Dynamic voltage frequency scaling can also be performed to transition to a lower target clock frequency and associated target voltage, again dynamically updating the output frequency (via feedback ratio setting) and reference clock selection according to a frequency walk sequence chosen to satisfy system requirements (such as timing safety margins or phase locked loop behavioral constraints). The frequency walk may be performed while the voltage is ramped down to the lower voltage, so as to minimize unwanted latency from phase locked loop settling.

Figure 7:
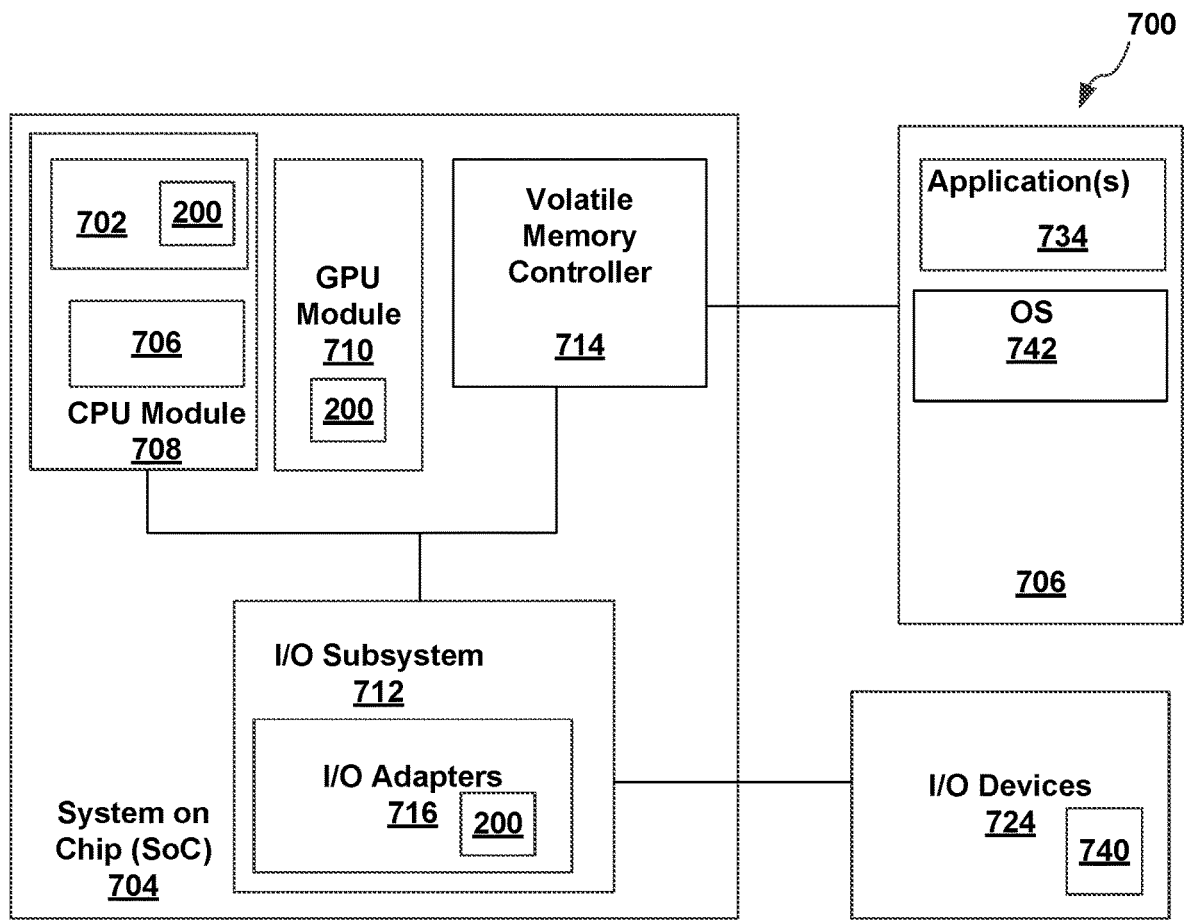
FIG. 7 is a block diagram of an embodiment of a computer system that includes dynamic frequency scaling circuitry as shown in FIG. 2.

FIG. 7 is a block diagram of an embodiment of a computer system 700 that includes dynamic frequency scaling circuitry 200. Computer system 700 can correspond to a computing device including, but not limited to, a server, a workstation computer, a desktop computer, a laptop computer, and/or a tablet computer.

The computer system 700 includes a system on chip (SOC or SoC) 704 which combines processor, graphics, memory, and Input/Output (I/O) control logic into one SoC package. The SoC 704 includes at least one Central Processing Unit (CPU) module 708, a volatile memory controller 714, and a Graphics Processor Unit (GPU) 710.

The dynamic frequency scaling circuitry 200 in SoC 704 can perform dynamic voltage frequency scaling to transition to a higher target clock frequency and associated target voltage. The dynamic voltage frequency scaling is performed in milli-second timeframe state changes, by dynamically varying a reference clock based on the current ratio while gradually increasing the clock frequency (also referred to as a frequency walk), and switching to a slower reference clock (finer resolution) as appropriate. For example, Dynamic frequency scaling circuitry 200 in processor core 702 can be used to increase the clock frequency to perform a task such as video playback-related image decompression, then decrease the clock frequency in a low-power mode while waiting for the next processor task. The change in clock frequency based on processor tasks can be referred to as "sprint-to-stop". Dynamic frequency scaling circuitry 200 can also be included in a display engine or graphics engine in the Graphics Processor Unit (GPU) 710 and in a display engine or image processing unit in I/O adapters 716.

In an embodiment, each compute engine (core, Graphics, display engine, image processing unit, vision processing unit, etc.) each has one PLL for the entire compute engine. In another embodiment, there can be one PLL per cluster of cores.

Within the I/O subsystem 712, one or more I/O adapter(s) 716 are present to translate a host communication protocol utilized within the processor core(s) 702 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 716 can communicate with external I/O devices 724 which can include, for example, user interface device(s) including a display and/or a touch-screen display device(s) 740, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

The I/O adapters 716 can include a Peripheral Component Interconnect Express (PCIe) adapter that is communicatively coupled using the NVMe (NVM Express) over PCIe (Peripheral Component Interconnect Express) protocol over a bus 744 to a Solid State Drive. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus). The NVM Express standards are available at www.nvmexpress.org. The PCIe standards are available at www.pcisig.com.

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

In other embodiments, the volatile memory controller 714 can be external to the SoC 704. Although not shown, each of the processor core(s) 702 can internally include one or more instruction/data caches, execution units, prefetch buffers, instruction queues, branch address calculation units, instruction decoders, floating point units, retirement units, etc. The CPU module 708 can correspond to a single core or a multi-core general purpose processor, such as those provided by Intel® Corporation, according to one embodiment.

Volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein can be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at wwwjedec.org.

An operating system 742 and application(s) 734 can be stored in volatile memory 706. Application(s) 734 can include an application for a video conference and/or an application to edit a document. The operating system 742 is software that manages computer hardware and software including memory allocation and access to I/O devices. Examples of operating systems include Microsoft® Windows®, Linux®, iOS® and Android®.

An embodiment has been described for an analog phase-locked loop. The frequency crawl finite state machine can also be used in a digital phase-locked loop and an analog or digital frequency-locked loop. The phase-locked loop or frequency-locked loop operates in closed loop during the frequency walk. Retiming/hand-shaking is not required because there is no switching between closed loop and open loop. Also, computations can continue during the frequency walk because the phase-locked loop is enabled and operating in closed-loop. By continuing to compute during the frequency transition, the overall throughput of the system for a given utilization of low-power opportunities is improved.

For example, a thread can continue to execute in a core while the frequency of the phase-locked loop in the core is being changed.

In addition, updates to the voltage controlled oscillator that can introduce jitter and clock crossing latency in the phase-locked loop are not required.

Jitter is mitigated by walking the frequency in small steps. Dynamic updates to the reference clock during the frequency walk permit selecting the fastest reference clock for a given ratio, which reduces accumulated phase error in the output clock. Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
   a phase-locked loop to generate an output clock having a frequency dependent on a reference clock and a feedback clock; and
   frequency crawl circuitry communicatively coupled to the phase-locked loop, to dynamically select the reference clock and the feedback clock to adjust the frequency in discrete variable-size frequency steps until the frequency is at a target frequency, a size of a frequency step is a smallest frequency step or a multiple of the smallest frequency step, the phase-locked loop operates in closed loop while the frequency is adjusted.

2. The apparatus of claim 1, wherein the frequency is increased while an associated voltage is gradually ramped up to a target voltage.

3. The apparatus of claim 1, wherein the frequency is decreased while an associated voltage is gradually ramped down to a target voltage.

4. The apparatus of claim 1, wherein the phase-locked loop is analog.

5. The apparatus of claim 1, wherein the phase-locked loop is digital.

6. The apparatus of claim 1, wherein the size of the frequency step is dependent on a nearest faster reference clock.

7. The apparatus of claim 1, wherein the size of the frequency step is selected to not overshoot the target frequency.

8. The apparatus of claim 1, wherein the size of the frequency step is selected to not undershoot the target frequency.

9. A method comprising:
   generating, by a phase-locked loop, an output clock having a frequency dependent on a reference clock and a feedback clock; and
   dynamically selecting the reference clock and the feedback clock to adjust the frequency in discrete variable-size frequency steps until the frequency is at a target frequency, a size of a frequency step is a smallest frequency step or a multiple of the smallest frequency step, the phase-locked loop operates in closed loop while the frequency is adjusted.

10. The method of claim 9, wherein the frequency is increased while an associated voltage is gradually ramped up to a target voltage.

11. The method of claim 9, wherein the frequency is decreased while an associated voltage is gradually ramped down to a target voltage.

12. The method of claim 9, wherein the phase-locked loop is analog.

13. The method of claim 9, wherein the phase-locked loop is digital.

14. The method of claim 9, wherein the size of the frequency step is dependent on a nearest faster reference clock.

15. The method of claim 9, wherein the size of the frequency step is selected to not overshoot the target frequency.

16. The method of claim 9, wherein the size of the frequency step is selected to not undershoot the target frequency.

17. A system comprising:
   a processor, the processor comprising:

a phase-locked loop to generate an output clock having a frequency dependent on a reference clock and a feedback clock; and frequency crawl circuitry communicatively coupled to the phase-locked loop, to dynamically select the reference clock and the feedback clock to adjust the frequency in discrete variable-size frequency steps until the frequency is at a target frequency, a size of a frequency step is a smallest frequency step or a multiple of the smallest frequency step, the phase-locked loop operates in closed loop while the frequency is adjusted; and a display communicatively coupled to the processor.

18. The apparatus of claim 1, wherein the smallest frequency step is equal or less than 16.67 Mega Hertz.

19. The method of claim 9, wherein the smallest frequency step is equal or less than 16.67 Mega Hertz.

20. The system of claim 17, wherein the smallest frequency step is equal or less than 16.67 Mega Hertz.

* * * * *